United States Patent [19]

Turner

[11] Patent Number: 5,289,151

[45] Date of Patent: Feb. 22, 1994

[54] ELECTRICAL COILS

[75] Inventor: Robert Turner, Bethesda, Md.

[73] Assignee: British Technology Group Limited, London, England

[21] Appl. No.: 933,896

[22] Filed: Aug. 24, 1992

Related U.S. Application Data

[63] Continuation of Ser. No. 282,812, Dec. 12, 1988, abandoned.

[30] Foreign Application Priority Data

Dec. 11, 1987 [GB] United Kingdom ............... 8729037

[51] Int. Cl.$^5$ .............................................. H01F 5/00
[52] U.S. Cl. ...................................... 335/299; 335/296
[58] Field of Search ................... 335/296, 299, 216; 324/318, 319, 320

[56] References Cited

U.S. PATENT DOCUMENTS

| | | |
|---|---|---|
| 4,339,718 | 7/1982 | Bull et al. . |
| 4,617,516 | 10/1986 | Schenck et al. . |
| 4,621,236 | 11/1986 | Halbach . |
| 4,646,024 | 2/1987 | Schenck et al. . |
| 4,725,803 | 2/1988 | Prevot et al. . |
| 4,895,831 | 1/1990 | Laskaris ............... 335/299 |
| 4,895,831 | 1/1990 | Laskaris . |

FOREIGN PATENT DOCUMENTS

| | | |
|---|---|---|
| 0136536 | 4/1985 | European Pat. Off. . |
| 0140269 | 5/1985 | European Pat. Off. . |
| 0216590 | 4/1987 | European Pat. Off. . |
| 0225814 | 6/1987 | European Pat. Off. . |
| 0274149 | 7/1988 | European Pat. Off. . |
| 62-230009 | 10/1987 | Japan . |
| 8604687 | 8/1986 | PCT Int'l Appl. . |
| 2050062 | 12/1980 | United Kingdom . |
| 2133558 | 7/1984 | United Kingdom . |

OTHER PUBLICATIONS

Kelha et al., "Construction of Demagnetizing Coils for Benefication Process", ACTA Polytechnica Scandinavica Phys. Ser. No. 115, 1976, pp. 4–28.

British Search Report (Attached: Dr. Turner's Detailed Comments).

Primary Examiner—Lincoln Donovan
Attorney, Agent, or Firm—Cushman, Darby & Cushman

[57] ABSTRACT

A method of designing a coil or set of coils to achieve a coil with minimum or substantially minimum inductance to produce a desired magnetic field.

11 Claims, 5 Drawing Sheets

ELECTRICAL COILS

This is a continuation of application Ser. No. 07/282,812, filed on Dec. 12, 1988 now abandoned.

The present invention relates to electrical coils intended to generate magnetic fields and more particularly to a method of designing coils with a minimum inductance to produce a desired magnetic field and to the coils when designed.

For many scientific purposes it is desirable to switch magnetic fields rapidly. For this reason coils generating these fields should have low inductance, since the switching time depends on L/R, where L is the inductance and R is the coil resistance.

Generally a specific variation of the magnetic field generated by the coil is required. Coil designers have usually been more concerned with ensuring a correct field distribution within the region of interest than with minimising the inductance, largely because calculation of the inductance was regarded as extremely difficult. The difficulty was such that the computation could not be performed in a systematic way, and hence it was not possible in most cases to show analytically that the inductance obtained was actually the minimum consistent with the desired coil performance.

Recently, however, a new formulation of the magnetic fields generated by currents confined to cylindrical shells has led to an attractively simple expression for the inductance of any coil formed on a cylinder. This expression lends itself, in conjunction with a variant on the target field approach described in co-pending British Patent Application No. 8714434, to the design of coils which accurately generate specified fields within a volume of interest, and which can have the absolute minimum inductance consistent with their performance.

It is an object of the present invention to provide a method of designing coils with minimum inductance and to build coils to those designs.

The present invention therefore provides a method of designing a coil or a set of coils in which the conductors of the coil are positioned on one or more coaxial cylinders or parallel planes, in which the coil or set of coils have minimum inductance consistent with generating a given field, per unit current, at a finite set of specified points.

Preferably each point in the finite set of points is selected such that the field is specified within a known volume. In a particular embodiment a first number of the finite set of specified points are selected as being on the surface of an outer cylinder and the rest of the finite set of specified points are selected as being on the surface of an inner cylinder the field between the inner and outer cylindrical surfaces thereby being defined.

In a further embodiment a first number of the finite set of specified points are selected as being on a first plane and the rest of the rest of the finite set of specified points are selected as being on a second plane the field between the first and second planes being thereby defined.

Embodiments of the present invention will now be described, by way of example with reference to the accompanying drawings in which.

THEORETICAL EXPLANATION

Figure 1:
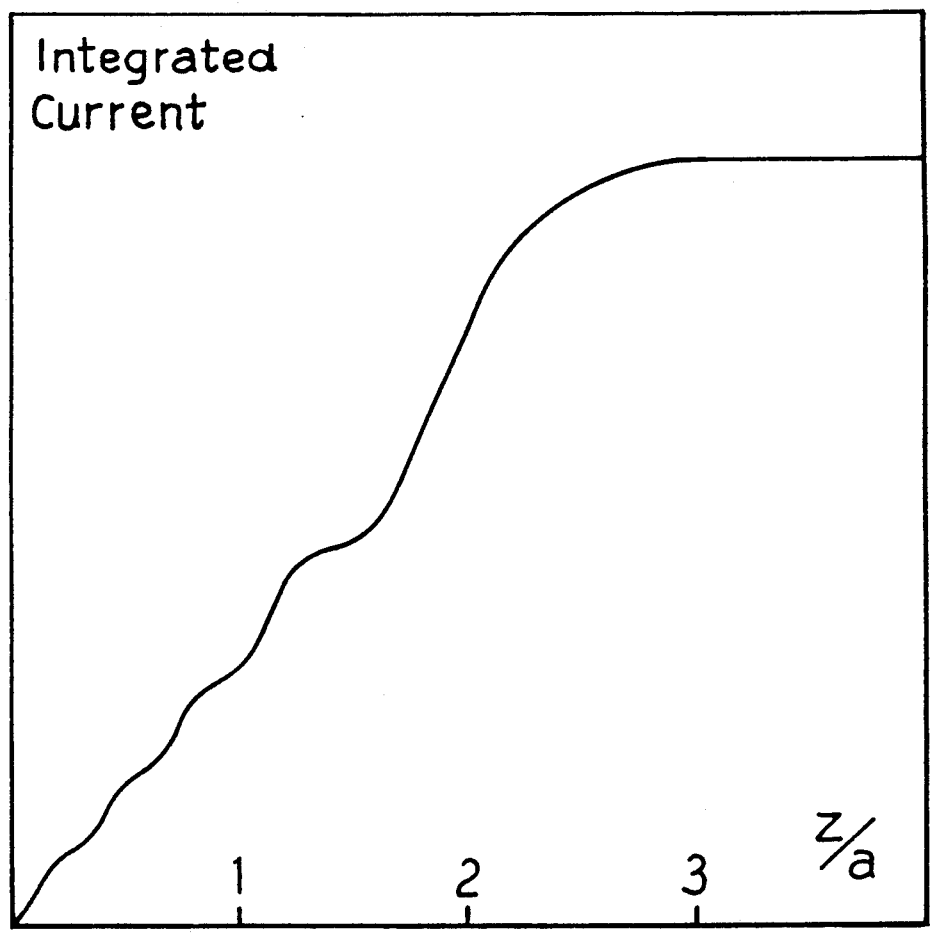
FIG. 1 shows a graph illustrating integrated current density for a field specified to be the same at 10 points along the axis at equal spacings of 1/10th of the coil radius.

Assume that the current generating the desired field is confined to the surface of a cylinder radius a. This assumption may be relaxed to include the case of current flowing in the wall of a thick cylinder, and the case of a screened coil (in which the coil is surrounded either by a thick conductive cylinder or by actively driven wire mimicking the effect of such a cylinder).

The current density is defined as $j(r,\phi,z)$. As in the article TURNER R and BOWLEY R. M. (1986) "Passive switching of switched magnetic field gradients", J. Phys. E. Sci. Instru. 19,876 we define the Fourier transform of the current densities in the azimuthal and axial directions as:

$$j_z{}^m(k) = \frac{1}{2\pi} \int_{-\pi}^{\pi} d\phi\, e^{-im\phi} \int_{-\infty}^{\infty} dz\, e^{-ikz} j_z(\phi,z) \quad (1)$$

$$j_\phi{}^m(k) = \frac{1}{2\pi} \int_{-\pi}^{\pi} d\phi\, e^{-im\phi} \int_{-\infty}^{\infty} dz\, e^{-ikz} j_\phi(\phi,z) \quad (2)$$

Then the inductance of the coil may be written $$L = -\frac{\mu_0 a^2}{I^2} \sum_{m=-\infty}^{\infty} \int_{-\infty}^{\infty} dk\, |j_\phi{}^m(k)|^2 I_m'(ka) K_m'(ka) \quad (3)$$

where I is the current in each turn of the coil. The axial component of the magnetic field is $$B_z(r,\phi,z) = \quad (4)$$

$$-\frac{\mu_0 a^2}{2\pi} \sum_{m=-\infty}^{\infty} \int_{-\infty}^{\infty} k\, dk j_\phi{}^m(k) e^{im\phi} e^{ikz} K_m'(ka) I_m(kr)$$

For a screened coil, with screen radius b, the integrand in each of these expressions (3) and (4) must be multiplied by the factor S(a,b,k), where $$S(a,b,k) = 1 - \frac{I_m'(ka) K_m'(kb)}{I_m'(kb) K_m'(ka)} \quad (5)$$

Defining n normalised current density f=j/I, we may write the inductance as $$L = -\mu_0 a^2 \sum_{m=-\infty}^{\infty} \int_{-\infty}^{\infty} dk\, |f_\phi{}^m(k)|^2 I_m'(ka) K_m'(ka) \quad (6)$$

and the coil efficiency as $$\frac{B_z(r,\phi,z)}{I} = \quad (7)$$

$$-\frac{\mu_o a}{2\pi} \sum_{m=-\infty}^{\infty} \int_{-\infty}^{\infty} kdk\, f_\phi{}^m(k) e^{im\phi} e^{ikz} K_m{}'(ka) I_m(kr)$$

The desired magnetic field must be specified at a finite set of points lying on the surface of a cylinder, generally of radius much less than a. We write $$B_z(r_n,\phi_n,z_n) = B_n \qquad (8)$$

where $n = 1, 2, \ldots, N$.

We may now construct an expression involving Lagrange multipliers which enables the calculation of that current density distribution which minimises the coil inductance. We wish to minimise L subject to the condition (8). We define a function $U(f_\phi{}^m(k))$ by $$U = L + \frac{1}{I} \sum_{n=1}^{N} \lambda_n (B_n - B_z(r,\phi,z)) \qquad (9)$$

Where $B_n$ is the desired field and $B_z$ is the actual field at $r = (r_n, \phi_n, z_n)$.

Using functional differentiation, and assuming that $f\phi^m$ is either pure real or pure imaginary, we find the condition for a minimum in U:

$$0 = \int_{-\infty}^{\infty} dk \left[ -2\mu_o a^2 f_\phi{}^m(k) I_m'(ka) K_m'(ka) + \sum_{n=1}^{N} \lambda_n \frac{\mu_o a}{2\pi} k e^{im\phi_n} e^{ikz_n} K_m'(ka) I_m(kr_n) \right] \qquad (10)$$

This has the solution $$f_\phi{}^m(k) = \frac{k}{4\pi a I_m'(ka)} \sum_{n=1}^{N} \lambda_n I_m(kr_n) e^{im\phi_n} e^{ikz_n} \qquad (11)$$

Substituting back into (7) at the points at which the field is specified, we obtain $$\frac{B_l}{I} = \frac{-\mu_o}{8\pi^2} \sum_{m=-\infty}^{\infty} \int_{-\infty}^{\infty} k^2 dk \frac{K_m'(ka)}{I_m'(ka)} \sum_{n=1}^{N} \lambda_n I_m(kr_n) I_m(kr_l) e^{im(\phi_n + \phi_l)} e^{ik(z_n + z_l)} \qquad (12)$$

where again $n = 1, 2, \ldots, N$; $l = 1, 2, \ldots, N$

This constitutes a set of N linear simultaneous equations in N unknowns, which may be solved easily using Gaussian elimination, to give a set of values for $\lambda$. The current density can then be evaluated explicitly using (11) and $$j_\phi(\phi,z) = \frac{1}{2\pi} \sum_{m=-\infty}^{\infty} \int_{-\infty}^{\infty} e^{im\phi} e^{ikz} f_\phi{}^m(k) dk \qquad (13)$$

All that is now required to produce a practical coil design is to approximate the continuous current density thus derived by a set of discrete wire arcs each carrying a current I. The method for achieving this is described in copending U.K. Patent Applications Nos. 8622277 and U.S. Pat. No. 4,896,129, the disclosure of which is herein incorporated by reference; essentially each arc is placed along an equally spaced contour of the stream function in such a position that it carries the surface current from the areas on either side of it.

A similar analysis may be performed in the case of current confined to a plane or parallel planes. In the simplest useful case, here a purely azimuthal current is confined to two planes at $z = \pm d$, each of thickness 2c, the inductance can be written simply as:

$$L = \qquad (14)$$

$$\frac{\pi\mu_o}{I^2 c} \int_o^\infty \frac{dk}{k} \left( 1 + \frac{\sinh(kc)[e^{-2kd}\sinh(kc) - e^{-kc}]}{kc} \right) |j_\phi(k)|^2$$

where the current density j(k) is now the Hankel transform of j(r)

$$j_\phi(k) = \int_o^\infty rd + J_1(kr) j_\phi(r) \qquad (15)$$

The axial magnetic field may be written as:

$$B_z(r,\phi,z) = \mu_o I \int_o^\infty kdk J_0(kr) j_\phi(k) \frac{\sinh(kc)}{kc} e^{-kd} \cosh kz \qquad (16)$$

and again minimum inductance coil configurations may be derived. Of particular interest is a novel design for producing a uniform field, consisting of two pancake coils wound on parallel planes.

EXAMPLES

We will describe the three following examples of minimum inductance coils: a) solenoid, b) longitudinal gradient, and c) transverse gradient.

a) Solenoid

In this case only the $m = 0$ term is needed. The expressions (11) and (12) become $$f_\phi(k) = \frac{1}{4\pi a} \frac{k}{I_1(ka)} \sum_{n=1}^{N} \lambda_n I_0(kr_n) e^{ikz_n} \qquad (17)$$

and $$\frac{B_l}{I} = -\frac{\mu_o}{8\pi^2} \int_{-\infty}^{\infty} k^2 dk \frac{K_1(ka)}{I_1(ka)} \sum_{n=1}^{N} \lambda_n e^{ik(z_n + z_l)} \qquad (18)$$

It is adequate to specify the field along the cylinder axis:

$$B_n = B_z(o,o,z_n) = B_o \quad n = 1, 2, \ldots N \qquad (19)$$

Alternatively the field may be specified on the central plane:

$$B_n = B_z(r_n, o, o) = B_o \quad n = 1, 2, \ldots N \qquad (20)$$

Figure 2:
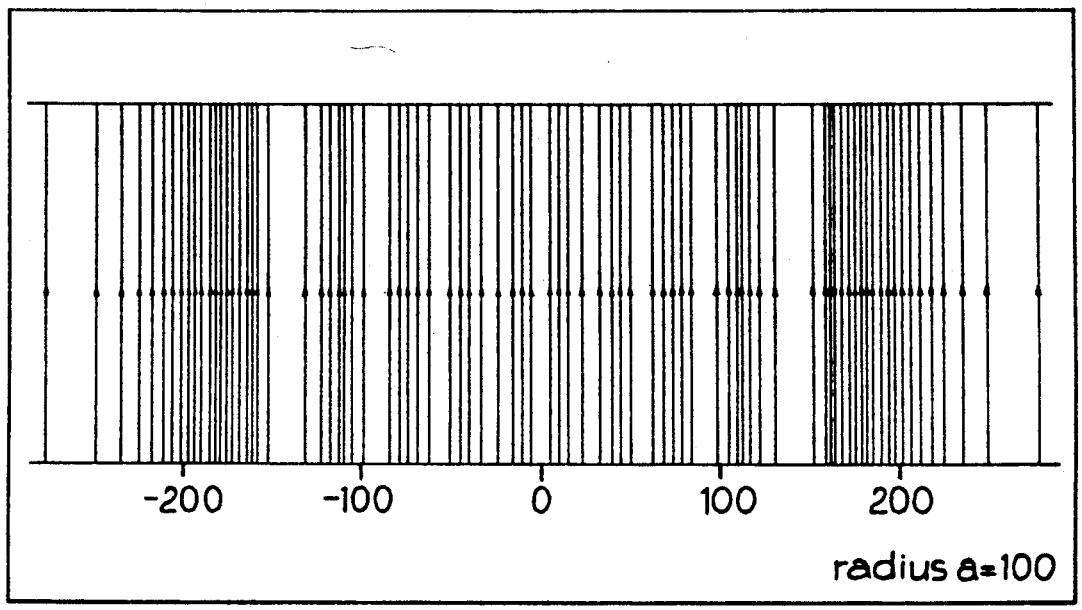
FIG. 2 shows the coil layout for a first specified coil design.

The example shown in FIG. 1 shows the integrated current density distribution when the field is specified to be the same at 10 points along the axis, at equal spacings of 1/10th of the coil radius. FIG. 2 shows the coil layout when 40 turns of 4 mm thick wire are used to approximate this current density. If the radius $a = 1$ m, the calculated inductance of this coil is 0.042H: the inductance of an Helmholtz pair giving the same axial homogeneity and current efficiency is 0.743H. The field produced by this coil design is precisely uniform at the points specified, and the homogeneity is better than 1 ppm for $z<1.0a$ and $r<0.6a$.

b) Longitudinal Gradient Coil

Figure 3:
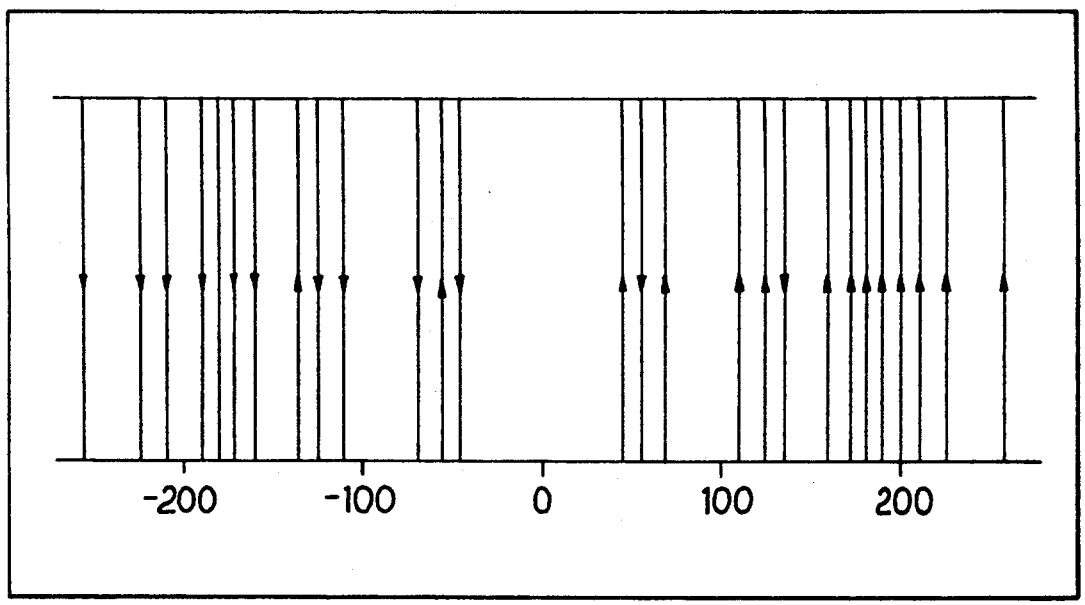
FIG. 3 shows the coil layout for a second specified coil design.

Here again only the $m=0$ term is needed. A little care must be taken to ensure that the current density derived has the required anti-symmetry about $z=0$; the Fourier sine transform is needed. Usually longitudinal gradient coils are specified to produce a magnetic field which is linear in z, and independent of r and $\phi$ out to a considerable fraction of the coil radius. The design shown in FIG. 3 arises from a field specified as linear at 10 equally-spaced points along the axis, at separations 0.1a. It has an inductance of 377 $\mu$H, compared with 8450 $\mu$H for the conventional Maxwell pair giving the same efficiency and linearity, when $a=1$ m and the wire thickness$=4$ mm.

c) Transverse Gradient Coil

To obtain a uniform transverse gradient only the $m=\pm 1$ terms are needed in the cylindrical harmonic expansion (4). This results in the following expressions for $B_z(r_1)$.

$$\frac{B_1}{I} = \frac{-\mu_o}{4\pi^2} \int_{-\infty}^{\infty} k^2 dk \frac{K_1(ka)}{I_1(ka)} \sum_{n=1}^{N} \lambda_n I_1(kr_n) I_1(kr_1) e^{ik(z_n+z_1)} \times \cos(\phi_n + \phi_1) \quad (21)$$

and $f_\phi^1(k)$ $$f_\phi^1(k) = \frac{1}{4\pi a} \frac{k}{I_1(ka)} \sum_{n=1}^{N} \lambda_n I_1(kr_n) e^{i\phi_n} e^{ikz_n} \quad (22)$$

Figure 4:
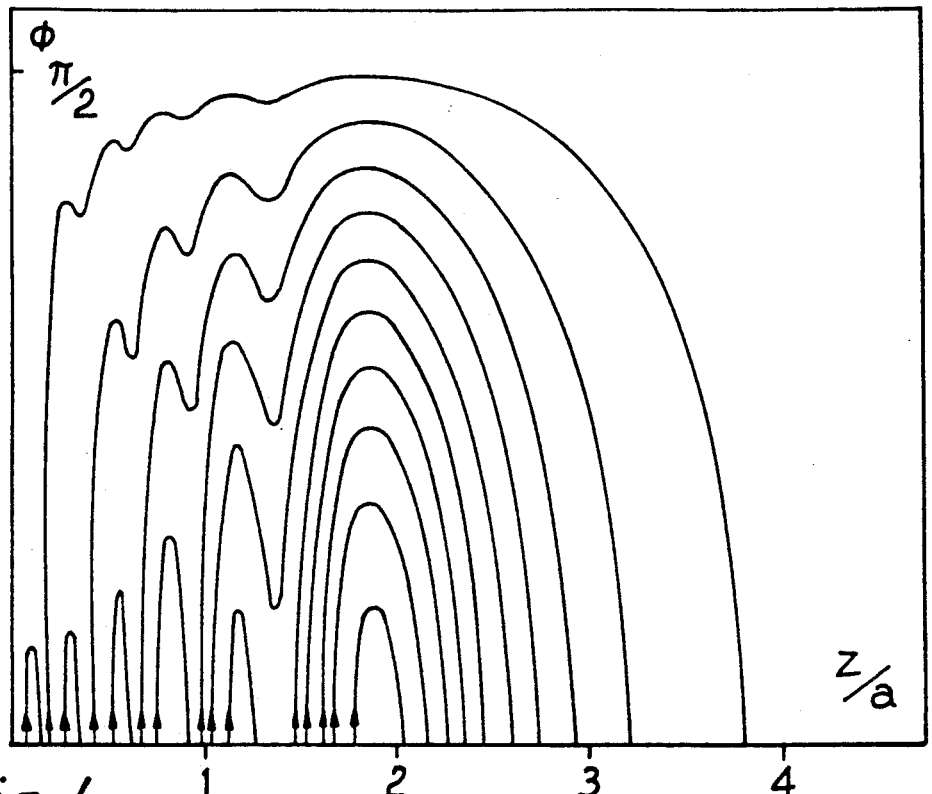
FIG. 4 shows a first typical coil designed according to the present method.
Figure 5:
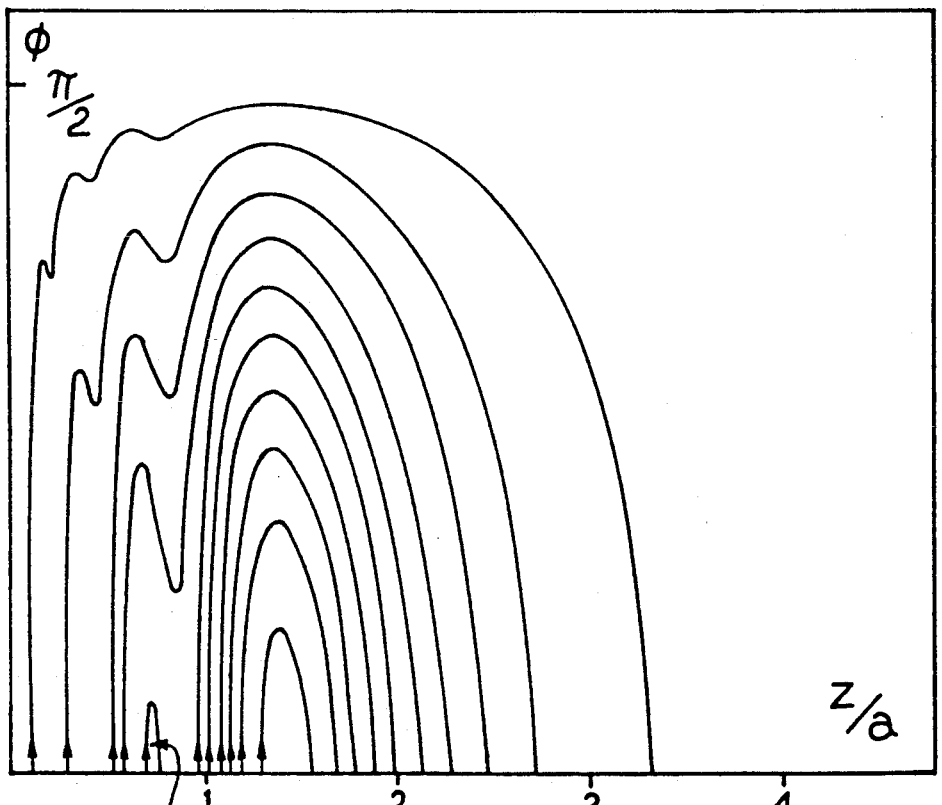
FIG. 5 shows a second typical coil designed according to the present method.

A typical coil design found by solving these, now using a field specified at ten points at $\phi=0$, $r=0.01a$ and spaced by 0.1a in the z direction, is shown in FIG. 4. A transverse gradient coil optimised for uniformity in the central plane, $z=0$, can also be derived, giving for example the design shown in FIG. 5. This coil gives a transverse gradient uniform to 2% out to $r=0.9a$ and $z=\pm 0.5a$.

Small loops such as SL (FIG. 5) can be eliminated in a systematic manner by multiplying the Fourier transform of current density (obtained by using procedures described hereinbefore) with the apodising function, $$e^{-k^2 t^2/2}$$

where t is a small distance chosen just large enough to eliminate the unnecessary undulations.

The resultant coil in general has a somewhat smaller inductance than the design prior to apodization, but this inductance is not the minimum consistent with producing exactly the required field at the selected points.

This simplified design sacrifices the desired field specification to a slight degree but leads to much simpler coil designs by eliminating small loops or rapid variation of turn spacing. The factor "t" has to be selected carefully, because as "t" is increased, conformity with the desired field specification at the selected points deteriorates. Typically t should be no more than a/10 (where a is the coil radius) which can give a coil producing the specified field at the selected points with an accuracy of 10 ppm.

We have described and illustrated a design principle which enables the construction of coils with the minimum inductance consistent with a given efficiency over a given volume. Of course all the coils shown have an actively-shielded counterpart, which may be derived simply by including the additional factor S(a,b,k) defined in equation (5). For purposes of rapid switching, as used in magnetic resonance imaging, it is hard to imagine how any further improvements in coil design strategy may be achieved.

In some circumstances it is necessary to restrict the length of a cylindrical coil. Using the minimum inductance formulation it is possible to design coils which have the lowest inductance consistent with an efficiency specified at a given number of points, while at the same time the coil is confined within a specified axial length. This constraint, that the current density is zero beyond a certain distance from the plane $z=0$, is introduced as a further set of Lagrange multipliers into equation (9), which becomes $$U = L + \frac{1}{I} \sum_{n=1}^{N} \lambda_n(B_n - B_z(r_n,\phi_n,z_n)) + \frac{1}{I} \sum_{p=1}^{P} \nu_p j_\phi(\phi_p,z_p) \quad (23)$$

where P is the number of points $(\phi_p, z_p)$ at which the current density is specified to be zero. We may write $$j(\phi_p,z_p) = \frac{1}{2\pi} \sum_{m=-\infty}^{\infty} e^{im\phi_p} \int_{-\infty}^{\infty} dk e^{ikz_p} j_\phi^m(k) \quad (24)$$

and hence, taking the functional derivative of U as before, we obtain $$0 = -2\mu_0 a^2 f_\phi^m(k) I_m'(ka) K_m'(ka) + \quad (25)$$

$$\sum_{n=1}^{N} \lambda_n \frac{\mu_0 a}{2\pi} k e^{im\phi_n} e^{ikz_n} K_m'(ka) I_m(kr_n) + \sum_{p=1}^{P} \nu_p e^{im\phi_p} e^{ikz_p}$$

So $$f_\phi^m(k) = \frac{k}{4\pi a I_m'(ka)} \sum_{n=1}^{N} \lambda_n e^{im\phi_n} e^{ikz_n} I_m(kr_n) + \quad (26)$$

$$\frac{1}{2\mu_0 a^2 I_m'(ka) K_m'(ka)} \sum_{p=1}^{P} \nu_p e^{im\phi_p} e^{ikz_p}$$

Figure 6:
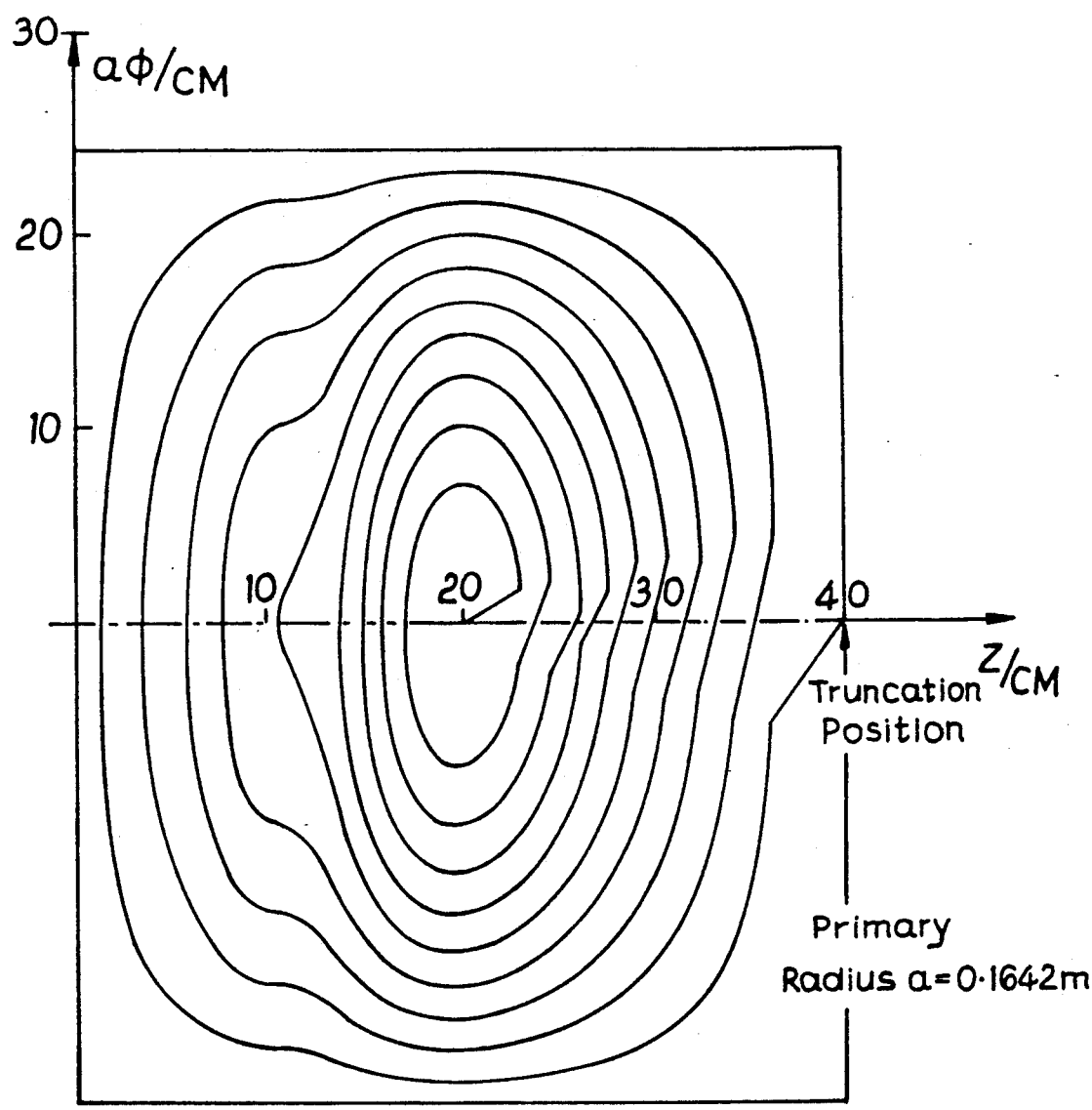
FIG. 6 shows a first truncated coil designed according to the present invention.
Figure 7:
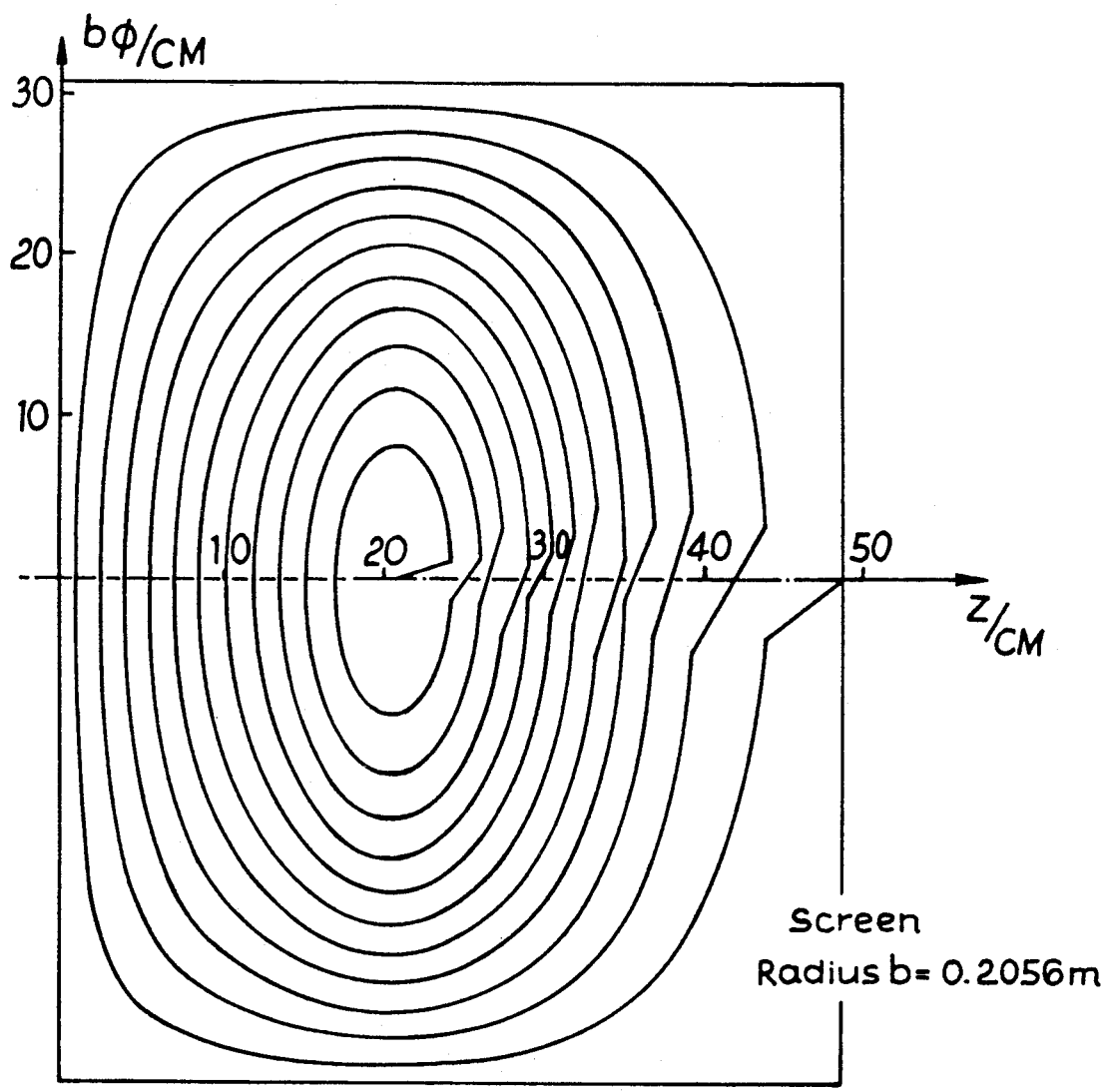
FIG. 7 shows a second truncated coil designed according to the present invention.

Using the argument presented earlier, we arrive at a set of N+P simultaneous equations in the N+P unknowns $\lambda_n$ and $Y_p$ which can again be solved by Gaussian elimination. The calculated current density is indeed zero at the points specified. In order to design an effective truncated coil it is only necessary to choose sufficiently many such points, sufficiently closely spaced, that the current density between them and beyond them remains substantially zero. For reasonable choices of coil parameters transverse gradient coil designs are easily derived, as shown in the FIGS. 6 and 7 which respectively show primary and screen coil designs to achieve the desired current density distributions.

I claim:

1. A solenoid coil in which the inductance L of the coil is defined by the expression:

$$L = -\frac{\mu_o a^2}{I^2} \sum_{m=-\infty}^{\infty} \int_{-\infty}^{\infty} dk |j_\phi{}^m(k)|^2 I_m'(ka) K_m'(ka)$$

wherein I is the current in each turn of the coil and in which the coil comprises a set of discrete wire arc each arc being placed along an equally spaced contour of the stream function in such a position that it carries the surface current from the areas on either side of it, the surface current density being defined by the expression $$j_\phi(\phi,z) = \frac{1}{2\pi} \sum_{m=-\infty}^{\infty} \int_{-\infty}^{\infty} e^{im\phi} e^{ikz} j_\phi{}^m(k) dk$$

2. A coil assembly comprising:
at least one coil having conductors which are positioned on at least one coaxial cylinder or parallel plane such that its conductors have minimum inductance based on a predetermined field, per unit current, at a predetermined finite set of specified points.

3. A method of forming a coil or a set of coils, comprising:
determining a current density which provides a minimum inductance consistent with generating a given field, per unit current, at a finite set of specified points on coaxial cylinders or parallel planes;
using said condition of minimum inductance to determine positions of conductors of the coil on said coaxial cylinders or parallel planes; and
supplying the coil or set of coils with a predetermined current to produce the given field per unit current at a finite set of specified points.

4. A method of designing a coil as claimed in claim 3 in which each point in the finite set of points is selected such that the field is specified within a known volume.

5. A method of designing a coil as claimed in claim 4 in which a first number of the finite set of specified points are selected as being on the surface of an outer cylinder and the rest of the finite set of specified points are selected as being on the surface of an inner cylinder and the field between the inner and outer cylindrical surfaces thereby being defined.

6. A method of forming a coil or set of coils comprising the steps of:
specifying a desired magnetic field per unit of applied electrical current at a finite set of points specified in space, and a set of one or more coaxial cylinders or parallel planes on which the coil is to be formed; and
evaluating a unique current density distribution on the specified coaxial cylinders or parallel planes required to generate this specified field at the specified points, which has a minimum inductance consistent with generating the specified field at the specified points; and
positioning conductors on the coaxial cylinders or planes in a coil configuration which provides, when energized, substantially the said unique current density distribution.

7. A method of designing a coil as claimed in claim 3 in which each point in the finite set of points is selected such that the field is specified within a known volume.

8. A method of designing a coil as claimed in claim 7 in which a first number of the finite set of specified points are selected as being on the surface of an outer cylinder and the rest of the finite set of specified points are selected as being on the surface of an inner cylinder, the field between surfaces of the inner and outer cylinders thereby being defined.

9. A method of designing a coil as claimed in claim 7 in which a first number of the finite set of specified points are selected as being on a first plane and the rest of the finite set of specified points are selected as being on a second plane the field between the first and second planes being thereby defined.

10. A method of designing a coil as claimed in claim 8 in which the coil is specified by a desired current density evaluated by the following expression $$j_\phi(\phi,z) = \frac{1}{2\pi} \sum_{m=-\infty}^{\infty} \int_{-\infty}^{\infty} e^{im\phi} e^{ikz} j_\phi{}^m(k) dk$$

11. A method of designing a coil as claimed in claim 9 in which a purely azimuthal current is confined to two planes at $z = \mp d$ each of thickness $2c$ and in which the inductance is calculated from the following expression $$L = \frac{\pi\mu_o}{I^2 c} \int_0^x \frac{dk}{k} \left(1 + \frac{\sinh(kc)[e^{-2kd}\sinh(kc) - e^{-kc}]}{kc}\right) |j_\phi(k)|^2$$

and wherein the current density j(k) is the Hankel transform of j(r) such that $$j_\phi(k) = \int_0^x rd + J_1(kr) j_\phi(r)$$

the axial magnetic field being $$B_z(r,\phi,z) = \mu_o I \int_0^x k dk J_0(kr) j_\phi(k) \frac{\sinh(kc)}{kc} e^{-kd} \cosh kz$$

* * * * *